United States Patent

[11] 3,621,112

[72] Inventors Beryl C. Stickley; Edward G. Tutle, both of Waynesboro, Va.
[21] Appl. No. 84,941
[22] Filed Oct. 28, 1970
[45] Patented Nov. 16, 1971
[73] Assignee General Electric Company
Continuation of application Ser. No. 741,011, June 28, 1968, now abandoned. This application Oct. 28, 1970, Ser. No. 084,941

---

[54] HOUSING FOR ELECTRICAL COMPONENTS
9 Claims, 8 Drawing Figs.

[52] U.S. Cl. .................................. 174/50.52, 174/50.61, 174/51, 174/52 S, 317/101 C
[51] Int. Cl. .................................. H05k 5/06
[50] Field of Search .................................. 174/50.5, 50.52, 50.53, 50.54, 50.61, 50.63, 51, 52 S, 52 PE; 317/101 CC, 101 C, 101 CB; 339/17 R, 17 C, 17 E, 17 L

[56] References Cited

UNITED STATES PATENTS

| | | | |
|---|---|---|---|
| 2,450,310 | 9/1948 | Sporing et al. | 174/51 |
| 3,139,678 | 7/1964 | Anthony et al. | 174/50.61 UX |
| 3,151,210 | 9/1964 | Hennessey et al. | 174/52 PE |
| 3,259,862 | 7/1966 | Richard | 174/52 PE |
| 3,331,912 | 7/1967 | Stricker et al. | 174/50.52 |
| 3,439,233 | 4/1969 | Braiman et al | 317/101 CC |

*Primary Examiner*—Lewis H. Myers
*Assistant Examiner*—D. A. Tone
*Attorneys*—Michael Masnik, Frank L. Neuhauser, Oscar B. Waddell and Joseph B. Forman ABSTRACT: A housing for electrical components that is suitable for mounting on printed circuit boards or other supporting members to be used in electrical-electronic equipment. The housing has a generally regular configuration (preferably rectangular), is enclosed on all sides, and preferably is fabricated from electrically conductive and ferromagnetic material. At least one surface of the housing (generally the bottom) has a plurality of housing supporting projections, preferably in the form of integral embossments, extending a predetermined distance for raising the housing above the surface of the printed circuit board or other supporting member a sufficient amount to provide for further processing or use such as to accommodate a cleaning or cooling flow of fluid. The projections are irregularly arrayed with respect to the sides of the housing and provide both tactile and visual indicators for facilitating proper alignment of the housing during placement on a printed circuit board or other supporting member. A plurality of electrically conductive leads extend through insulated openings in the bottom of the housing and are located at the intersections of an equally spaced grid system. The projections extending from the bottom of the housing are positioned so as to be located at selected spots corresponding to the intersections of the same equally spaced grid system that locates the electrically conductive leads. A greater number of the projections are formed on one side of the housing than are formed on the other in order to provide the irregularity in the array of projections required to facilitate alignment of the component during placement on a printed circuit board or other supporting member. Grounding strips of conductive material may be attached to the sides of the housing and where so attached, are so positioned relative to the intersections of the same equally spaced grid system locating the electrically conductive leads and projections as to fit into a logical extension of the equally spaced grid system. The sides of the housing may be hermetically sealed closed to provide a protective environment for the electrical components contained therein.

INVENTOR.
BERYL C. STICKLEY
EDWARD G. TUTLE

BY Stanley C. Corwin
THEIR ATTORNEY

INVENTOR.
BERYL C. STICKLEY
EDWARD G. TUTLE
BY Stanley C. Corwin
THEIR ATTORNEY

HOUSING FOR ELECTRICAL COMPONENTS

The present invention is a continuation of our copending application Ser. No. 741,011, filed June 28, 1968, now abandoned, and assigned to the same assignee as the present invention.

BACKGROUND OF INVENTION

1. Field of Invention

This invention relates to new and improved housings for electrical components.

More particularly, the invention relates to housings for electrical-electronic components suitable for mounting on supporting members such as printed circuit boards, printed wiring boards and the like. By electrical-electronic components is meant either a single component such as a relay switch capsule, a capacitor, a battery, resistor, etc., or desired combinations of such elements interconnected in electrical circuit relationship and their interconnecting conductors. At least one surface of the housing (preferably the bottom) includes means for raising the bottom of the housing above the surface of the circuit board to facilitate further processing of the circuit board after placement of the housing and its components to allow circulation of cooling air, etc., and to permit increased circuit density, etc. The raising means comprise projections extending from the bottom of the housing and are so arrayed relative to the terminal leads secured to the housing for connection to the components contained therein that they comprise part of an equally spaced grid system whose intersections define the points of connection of the terminal leads. By this arrangement, the design of high-density circuit boards using the components enclosed within the housings, is greatly facilitated, The housings may be completely hermetically sealed to provide a protective environment for the components contained therein.

DESCRIPTION OF PRIOR ART

In the manufacture of electrical-electronic equipment, electrical interconnections between the several components comprising the equipment are quite often made through the medium of printed circuit boards that employ printed wire conductors formed on the surface of an insulating member that is used to support the components. The placement of the components on the printing wiring board in a manner to increase the number (density) of components mounted on a given size board, and providing for a maximum number of printed wire conductors on the surface of the board, is itself an art requiring considerable skill.

One of the problems encountered in the manufacture of electrical-electronic circuits in the above manner arises after placement of the component on the printed circuit board. At this stage in the manufacture of the equipment it is necessary to clean and dry the circuit board, and this cleaning and drying operation can result in the lodgment of particles between the component housings and the printed wire conductors with consequent improper cleaning, drying possible short circuits, etc.

In addition to the above problem, known techniques for mounting component housings on printed circuit boards have required that areas of the board be set aside exclusively for the component housing. This has decreased circuit density with a resultant increase in the size and weight of the equipment. Further, design of the circuit board has been hampered due to the fact that there was no fixed coordinate system for use as guides in providing the interconnecting printed wire conductors between the several components, nor has the spacing allowed for such printed conductors been optimized to provide maximum circuit density.

Another problem arising out of existing manufacturing techniques has arisen where a given component is polarity sensitive, position sensitive, etc., and must be be properly aligned prior to placement on the supporting circuit board member. In this situation, heretofore, small and difficult to interpret markers have sometimes been provided on the component housings to indicate which end of the housing to place where. In other instances, the component housings have been provided with an unequal number of electrically conductive leads emerging from opposite ends of the housing or such that the housing cannot be placed until the leads align properly with an equivalent pattern of holes drilled in the circuit board. In both situations, the proper alignment has been difficult to interpret and in many instances improper alignment of the component has occurred with resultant failure of the equipment.

A still further problem arises from the need for providing suitable grounding connections for certain of the components which connections are harmonious with the layout of the printed circuit board. It is also desirable in many equipments, particularly military electronic equipment, that at least certain of the components of the equipment, if not all, be provided with their own protective environment. Hence, magnetically shielded and hermetically sealed housings for such components is often a requirement.

SUMMARY OF INVENTION

It is therefore a primary object of the invention to provide new and improved housings for electrical-electronic components for mounting on printed circuit board supporting members, and which have the bottom thereof raised above the surface of a supporting member to allow for a flow of cleaning or cooling fluid between the component housing and the supporting member, as well as to allow for the provision of conductive pathways under the housing, hence increasing the number of printed circuits that can be placed on a given size supporting circuit board member.

Another object of the invention is to provide such housings having off-setting projections from the bottom thereof that are irregularly arrayed with respect to the sides of the housing and serve as both tactile and visual indicators for facilitating proper alignment and placement of the housing.

A further object of the invention is to provide electrical-electronic component housings having the above characteristics which further include a plurality of electrically conductive leads located at selected intersections of an equally spaced grid system so as to be arrayed in a regular matrix, and wherein the offsetting projections are included in and comprise part of the regular matrix with a greater number of projections being formed on one side of the housing than on the other to provide the irregularity in the array of projections needed to facilitate alignment of the component during placement on a supporting circuit board member.

A still further object of the invention is the provision of housings for electrical-electronic components of the above type which include grounding strips attached to the sides of the housings at points which constitute logical extensions of the matrix of leads and projections, and which are capable of being hermetically sealed and magnetically shielded.

In practicing the invention, a housing for an electrical component is provided for mounting on a supporting member that may comprise a printed circuit board and that supports at least some of the electrical components of an electrical equipment. The housing has a generally regular configuration (preferably rectangular) and is enclosed on all sides. At least one surface of the housing (generally the bottom) has a plurality of supporting projections extending therefrom a predetermined distance for raising the bottom of the housing above the surface of the supporting printed circuit board member of sufficient amount to provide for a cleaning or cooling flow of fluid therebetween. The projections are irregularly arrayed with respect to the sides of the housing to thereby provide both tactile and visual indicators for facilitating proper alignment and placement of the component on the supporting member.

The housing further includes a plurality of electrically conductive terminal leads which extend through insulated openings in the bottom of the housing and located at the intersections of an equally spaced grid system so as to be arrayed in a regular matrix. The center of the regularly arrayed conductive leads preferably are spaced apart a distance of 0.150 inch, or some multiple thereof. The housing supporting projections are positioned at intersections of the same equally spaced grid system including the terminal leads so as to be included in and comprise part of the regular matrix formed by the electrically conductive terminal leads. A greater number of projections are formed on one side of the housing than on the other to provide the irregularity in the array of projections needed to facilitate alignment of the component during placement on the supporting member. In preferred forms of the invention, the housing is formed from electrically conductive and ferromagnetic material and the supporting projections are integral embossments formed on the bottom of the housing. However, for certain circuit applications the housing supporting projections may be insulating members, or a sleeve of insulating material may be provided that surrounds at least part of selected ones of the leads for supporting the housing on electrically conductive surfaces of the supporting circuit board members in a manner to electrically insulate the integrally embossed projections from such conductive surfaces. Preferred forms of the housing further include grounding strips of conductive materials attached to the sides of the housing and so positioned relative to the regular matrix of electrically conductive leads and projections as to fit into a logical extension of the matrix pattern. The housings also preferably are hermetically sealed closed to provide a protective environment for the electrical component enclosed therein.

BRIEF DESCRIPTION OF THE DRAWINGS

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

DETAILED DESCRIPTION OF PREFERRED EMBODIMENT

Figure 1:
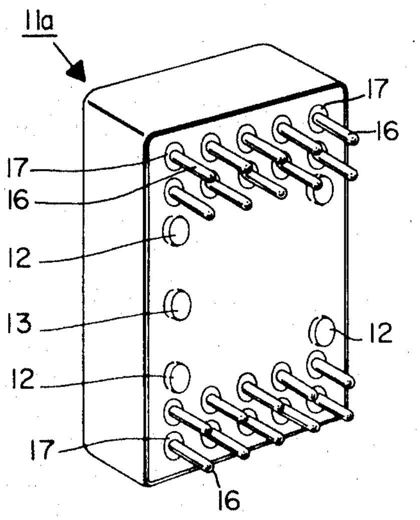
FIG. 1 is a perspective view of a preferred form of electrical component housing constructed in accordance with the invention, and viewed from the bottom side thereof.

FIG. 1 of the drawings is a perspective view of the bottom side of a preferred form of an improved housing for electrical components constructed in accordance with the invention, and which is adapted to be mounted on a printed wiring board, a printed circuit board or other suitable supporting member. In the following description the term "electronic component" is intended to include not only a signal component such as a relay switch capsule, a capacitor battery, resistor etc., but also includes desired combinations of such elements interconnected in electrical circuit relationship and the interconnecting conductors. The housing has a generally regular configuration (preferably rectangular) and is enclosed in all sides. The sides and the top of the housing may be fabricated from a stamped-out, electrically conductive, ferromagnetic material such as sheet metal so that it has a rectangular, match-box shape with the bottom side thereof open. The bottom side of the housing has a plurality of housing-supporting or standoff projections 12 formed thereon which extend for a predetermined distance, and may comprise a reinforcing, generally heavier gauge steel, header member on which the projections 12 are stamped in the form of integral embossments. Other means of forming the projections 12 will be described hereinafter in conjunction with other figures of the drawings.

Figure 3:
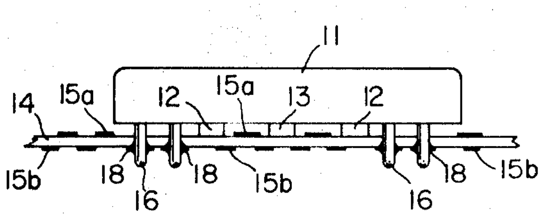
FIG. 3 is a side view of the component housing shown in FIG. 1 and illustrates the same mounted on a supporting circuit board member shown in cross section.

From a consideration of FIG. 1 , and the side view of the housing shown in FIG. 3, it will be seen that there is an additional projection (shown at 13) on the left side of the bottom of the housing as viewed by the reader. It will be appreciated therefore that the projections are irregularly arrayed with respect to the sides of the housing due to the extra projection 13. As a result, one side of the housing can be readily determined from the other both from observing the projections 12 and 13 and by feeling the same. This irregularity in the arrangement of the projections 12 and 13 provides both tactile and visual means for properly aligning the housing with respect to other components when placing it on a supporting member.

It should be further noted with respect to FIG. 1, that at least three (and in the particular housing shown in FIG. 1 there are four) projections 12 are located such that the center of mass of the housing lies within the area defined by such projections. As a result the projections 12 will provide a stable support for the housing 11.

FIG. 3 of the drawings illustrates the housing 11 shown in FIG. 1 mounted on a printed circuit supporting member 14. The supporting member may comprise the insulating backing of a printed circuit board having a plurality of printed wire conductors shown at 15*a* and 15*b* formed on the surface thereof over which the housing 11 is disposed as well as on the back side of the board. It will be noted in FIG. 3 that the projections 12 and 13 upon coming into engagement with the upper surface of the insulating support member 14 serve to raise the bottom of the housing 11 above this surface so as to provide a space between the bottom of the container and the upper surface of the supporting member 14. This spacing will allow for the flow of cleaning or cooling fluid between the supporting surface of member 14 and the bottom of the housing 11 during further processing and use.

This spacing also is arranged to raise the bottom of housing 11 sufficiently above the top of the printed wire conductors 15 to allow certain of the printed wire conductors to be placed underneath the housing. As a consequence, for a given size printed circuit board, more conductors can be run on the surface of the board than would otherwise be possible if the bottom of the housing rested upon the top of the insulating supporting board 14.

In assembling a housing such as shown in FIGS. 1 and 3 onto an insulating support member 14, it is entirely feasible that the electrical components enclosed within the housing are polarity sensitive and must be properly aligned with the connections to it provided by the printed wire conductors such as 15*a* and 15*b* . For this purpose, the irregular array of the projections 12 and 13 will readily identify both by touch (tactile) and visually to an assembler, or to an automatic assembling machine, which side of the housing 11 should be placed where.

Figure 8:
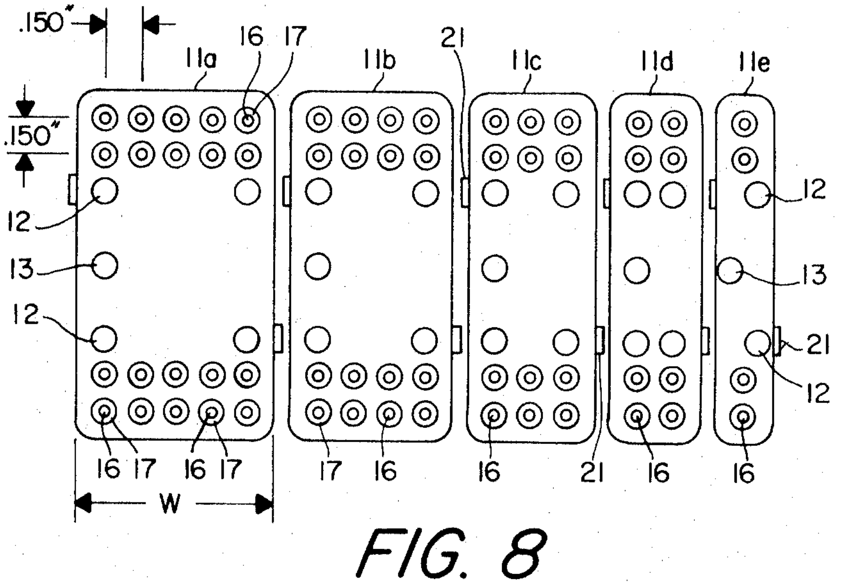
FIG. 8 is a plan view of a bottom of a plurality of component housings constructed in accordance with the invention showing the same mounted on a common circuit board supporting member, and illustrates the manner in which the leads and projections thereof together with the grounding strips are arrayed in a regular matrix so as to facilitate maximum circuit density design.

Referring again to FIG. 1 of the drawings, it will be seen that the housing 11 further includes a plurality of electrically conductive leads 16 which extend through glass insulators 17 formed in circular openings in the bottom of housing 11. The glass insulators 17 are formed in the process of securing leads 16 by means of glass-to-metal seal through openings in the bottom of the housing. The electrically conductive leads 16 are arrayed on the bottom of housing 11 intermediate the intersections of an equally spaced grid system as best shown in FIG. 8 of the drawings. The leads 16 are adapted to pass through openings in supporting member 14 and mate with suitable connectors 18 secured to the underside of supporting member 14, Also, it should be noted that the supporting projections 12 and 13 formed on the bottom of housing 11, are so positioned as to be located at selected intersections of the same equally spaced grid system including the conductive leads 16 and hence are included in and comprise part of a regular matrix formed by the electrically conductive leads 16 and projections 12 and 13. Further, it should be noted also, that on the left side of the bottom of housing 11 there is one more projection 13 included in the matrix than is provided on the opposite side. As a result, the irregularity in the array of the projections 12 needed to facilitate alignment of the component housing during placement on the supporting member, is provided.

Referring now to FIG. 8 of the drawings, a bottom view is shown of a plurality of electrical component housings 11*a* through 11*e*, mounted on a suitable, signal insulating supporting member 14. For purpose of illustration in FIG. 8 it is assumed that the insulating supporting member 14 is transparent so that the array of housing 11*a*–*11e* and their electrically conductive leads 16 and projections 12 can be visualized. From a consideration of FIG. 8 it will be seen that by proper placement of the component housings 11*a*–*11e* one next to the other, and by suitably proportioning and spacing adjacent housings, the midline of the space between the two housings can be made to pass through the centers of the intersections of a logical extension of the equally spaced grid system comprising the regular matrix formed by the conducting leads 16 and projections 12 and 13. For this purpose, the width of the housings, as indicated by the dimension W for housing 11*a* , is made to be just under some multiple of the grid intersection spacing. As indicated in FIG. 8, the preferred spacing between the intersections of the equally spaced grid system is 0.150 inch with all leads 16 and projections being located at some multiple of this spacing. It should be noted in this regard that the multiple may be one (1) as in the case of many of the leads 16, or it may be two (2) as in the case of the spacing between certain of the projections 12, etc. Further, by arranging to have the midlines between housings coincide with the intersections of the same equally spaced grid system including leads 16 and projections 12 and 13, grounding strips (to be described hereinafter) may be located at appropriate intersections along the midlines. In this manner the grounding strips can be appropriately located at the intersections of the equally spaced grid system.

By reason of the above-described arrangement transverse gridlines can be set down on the insulating supporting member 14 in advance of placement of the component housings on the insulating member, and certain of the intersections of these gridlines will identify the points at which conductive leads 16, or projections 12 and 13 (or grounding strips), are to be provided. By thus identifying such intersecting points of the regular matrix in advance, the remaining areas of the board can be freed (made available) as space on which printed wire conductors can be run thereby allowing increased circuit density.

It might also be noted in FIG. 8, that the component housings 11*a* –*11e* vary in their dimensions depending upon the nature of the electrical component to be mounted within each housing. Because of these variations, it is anticipated that the width W of the housings will vary perhaps in the manner shown by 11*a* –*11e* . Additionally, certain of the components enclosed within the housings may require fewer or less electrically conductive leads. In this event a vacant space will be left in the regular grid matrix at intersections of the equally spaced grid system where otherwise a lead might be located. Even in this eventuality, the proposed location of the majority of the conducting leads 16 and the location of the supporting projections 12 and 13 can be readily identified in advance by reason of the regular grid matrix arrangement of these elements of the housing. Again, it should be noted that the proportioning and placement of the housings is such that the distance between any two housings, for example 11*a* and 11 *b*, is adjusted so that a center line running between these two housings, would effectively run through intersection points of the same equally spaced grid system that established the location of the leads 16 and projections 12 and 13, if such were logically extended. This further facilitates knowledge in advance of placement of the component housings on the supporting members 14 of those areas of the supporting member 14 wherein printed conductive paths may be formed, and yet still be clear of conducting leads 16 or projections 12 and 13, or grounding strips to be described hereinafter. This feature is best illustrated in FIG. 3 of the drawings wherein it can be seen that the printed wire conductors 15*a* formed on the upper surface of the printed circuit board 14 are distributed so as to avoid the supporting projections 12 and 13 and conductive leads 16.

Figure 2:
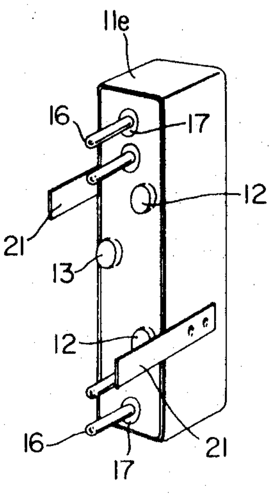
FIG. 2 is a side perspective view of a second preferred form of electrical component housing constructed in accordance with the invention.

As stated earlier, it is preferable that the sides and top of the housings 11 be formed of an electrically conductive and ferromagnetic material, such as a very thin gauge steel, which readily can be formed in a stamping operation. Because of the ferromagnetic characteristics of the material, the housings 11 will provide substantial magnetic shielding for the electrical-electronic components contained therein. Because certain of the components to be enclosed in the housings 11 may require all of the electrically conductive leads 16 that are available at the intersections of the grid system within the dimensions of the housing to provide necessary electrical connections to and from the components enclosed in the housing, it may prove necessary to provide ancillary grounding strips such as that shown at 21 in FIG. 2. The grounding strips 21 are attached to the sides of the housing 11 (which is electrically conductive) and, as shown in FIG. 8, are so positioned relative to the regular matrix established by the conductive leads 16 and projections 12 and 13, that the grounding strips 21 occupy positions that would correspond to the intersections of a logical extension of the same equally spaced grid system defining the location of leads 16 and projections 12 and 13. In this manner, the ancillary grounding strips 21 will not otherwise interrupt or upset the predictability of the availability of an area of the supporting insulating member 14 for use in running a printed wire conductor such as 15*a* shown in FIG. 3. The strips 21 generally would be inserted in suitable openings in the insulating supporting member 14 in the same manner as the conducting leads 16.

Figure 4:
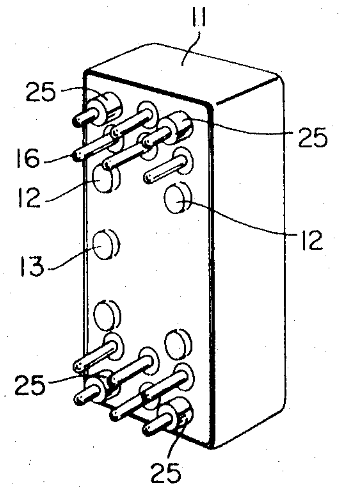
FIG. 4 is a side perspective view of a different form of component housing constructed in accordance with the invention and provided with suitable insulating sleeves around selected leads for holding the bottom of the housing off of a conductive surface on a supporting printed circuit board member.
Figure 5:
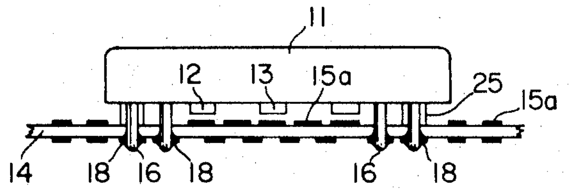
FIG. 5 is a side view of the component housing member shown in FIG. 5 and illustrates the same mounted on a supporting circuit board member shown in cross section.

FIGS. 4 and 5 of the drawings illustrate an embodiment of the invention which is to be used in those applications where the requirements for compactness and small size dictate extremely high density of numbers of printed conductive paths 15*a* on the insulating supporting member 14. Under these conditions, it is quite often necessary to form conductive paths not only on the underside of the board, such as shown at 15*b*, but also large members of paths may be formed on the upper side of the board as shown at 15*a*. Because of these requirements, it may be necessary to so mount the housing 11 that it is insulatingly supported above the conductive surfaces 15*a*, for example. As was stated above, a preferred form of the invention utilizes stamped out integral embossments to form the projections 12. Because these integral embossments are formed of electrically conductive material, they too must be maintained above the conductive surfaces 15*a*. For this purpose, extremely small insulating sleeves of an insulating material such as P.T.F. are located over certain of the exterior conductive leads 16 (preferably the outer corner leads) in the manner shown at 25. These insulating sleeves will then rest on top of supporting member 14 and will support the bottom of the housing 11 together with the projections 12 above the conductive surfaces 15a while at the same time providing all of the advantages heretofore enumerated.

Figure 6:
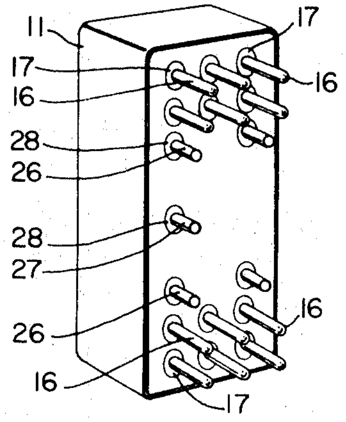
FIG. 6 is a bottom perspective view of still a third form of component housing constructed in accordance with the invention and provided with insulating supporting projections extending from the bottom surface thereof.
Figure 7:
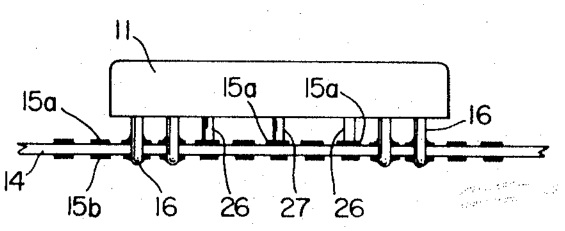
FIG. 7 is a side view of the form component housing shown in FIG. 6 and illustrates the same mounted on a supporting circuit board member.

FIGS. 6 and 7 of the drawings illustrate still another form of electrical component housing constructed in accordance with the invention and suitable for use with high density, dual-sided printed circuit boards. In the embodiment of the invention shown in FIGS. 6 and 7, the housing supporting projections (shown at 26 and 27) are insulating members, and are secured into holes formed in the bottom of the housing 11 by suitable glasS-to-metal seals that form a glass insulator such as shown at 28. The insulating members 26 and 27 preferably are comprised by cylindrically shaped ceramic pegs whose length can be suitably adjusted to provide a predetermined spacing between the bottom of the housing 11 and the upper conductive surfaces 15a of supporting member 14. The glass insulators 28 are formed by glass ceramic-to-metal seals of conventional construction. The projections 26 and 27 thus provided nevertheless are positioned along the bottom of housing 11 in the same manner as the projections 12 and 13 shown in FIG. 1, so that they fit into and comprise a part of a regular matrix, but at the same time omit one of the members 27 on one side of housing 11 so as to provide an irregularity that can be used in aligning the housing during placement. It should be noted with respect to FIG. 7, that the use of insulating projections 26 and 27 makes it possible to allow the projections to rest on top of the conductive pathways 15a without adversely affecting operation of an equipment employing such housings.

Referring again to FIG. 8 of the drawings, it will be seen that the preferred spacing of the center-to-center distance between the intersections of the matrix which defines or locates the centers of the electrically conducting terminal leads 16, projections 12 and 13, and grounding strip is preferably a distance of 0.150 inch or some multiple thereof. This spacing between the terminal leads 16 and projections 12 and 12 is preferred since it allows a greater circuit density than would be otherwise obtainable even with a lesser spacing distance. At present, there is no "standard" pin arrangement for miniature printed circuit board component connections. Although certain patterns appear to be popular, most manufacturers have chosen different internal connections so that interchangeability between components of several manufacturers is not possible. The housing arrangement described herein provides for such interchangeability, while at the same time making feasible higher component density on a given size insulating member than otherwise would be possible.

A preferred use of the housing made available by the invention is in connection with miniature relays of the type employed extensively in military equipment. This use places a requirement that the housing provide magnetic shielding and be capable of being hermetically sealed so as to provide a protective environment for the relay. The housing described herein satisfies there requirements. Further, such relays currently are capable of being mounted on printed boards with workable clearances that provide a maximum pin density of about 10 circuits per inch. The proposed 0.150-inch grid space pin arrangement illustrated in FIG. 8 makes it possible to provide maximum pin densities of about 13.3 circuits per inch, while at the same time providing adequate clearances to accommodate state of the art techniques for locating paths, drilling holes, etc., employed in the art of printed circuit board electronic equipment manufacture. All of these desirable characteristics are embodied in the housing of the invention which also provides magnetic shielding and is capable of being hermetically sealed so as to provide a protective environment for the electrical component enclosed within the housing.

From the foregoing description, it will be appreciated that the invention provides new and improved housings for electrical-electronic components of the type suitable for mounting on printed circuit boards printed wiring boards and other suitable supporting members. The housings are provided with projections for raising the bottom of the housings above the surface of the supporting member in order to allow for a cleaning and cooling flow of fluid between the bottom of the housing and the surface of the printed circuit board or other supporting member, as well as to accommodate conductive printed wiring paths along the surface of the supporting member underneath the container. As a result, the number of printed circuit interconnecting paths that can be placed on a given size, supporting, circuitboard member, is greatly increased. The housings made available by the invention have offsetting projections from the bottom thereof which in addition to serving as a means for raising the housing above the surface of a supporting printed circuit board member in the above manner, also are irregularly arrayed with respect to the sides of the housing so as to serve as both tactile and visual indicators for facilitating proper alignment of the housing during placement.

The housings further include a plurality of electrically conductive leads which are arrayed in a regular matrix, and wherein the offsetting projections are included in and comprise a part of the regular matrix. In this arrangement of a greater number of projections are formed on one side of the container than are formed on the other so as to provide the irregularity in the array of projections needed to facilitate proper alignment of the housing during placement on the supporting member. The invention further provides housings for electrical components which are formed from electrically conductive and ferromagnetic material and include grounding strips attached to the sides of the container at points which constitute logical extensions of the matrix and projections. The housings also are capable of being hermetically sealed so as to provide a protective environment for the electrical component enclosed within the container.

Having described several embodiments of improved housings for electrical-electronic components constructed in accordance with the invention, it is believed obvious that other modifications and variations of the invention are possible in the light of the above teachings. It is therefore to be understood that changes may be made in the particular embodiments of the invention described which within the full intended scope of the invention as defined by the appended claims.

What we claim as new and desire to secure by Letters patent of the United States is:

1. A housing for first electrical circuit components adapted for mounting on a supporting member that supports electrical conductors on its surface arranged on a given grid pattern, at least one surface of said housing being of generally regular configuration, said one surface comprising a plurality of electrical conductive leads extending from said housing and being arrayed at selected locations corresponding to given intersections of orthogonally related grid lines for connection to said first electrical circuit, said one surface also comprising a plurality of housing supporting projections extending therefrom a distance less than said electrically conductive leads for raising said at least one surface above the surface of said conductors a sufficient amount to provide for further processing and use, means providing tactile and visual indicators for facilitating proper alignment of the housing with respect to the location of the conductors on the supporting member comprising said projections being arrayed at selected locations corresponding to given intersections of said grid lines and in an array which is nonsymmetrical with respect to the sides of the housing, said housing supporting projections being cylindrically shaped insulating ceramic pegs secured to holes formed in said at least one surface of the housing by glass fusion.

2. A housing for first electrical circuit components adapted for mounting on a supporting member that supports electrical conductors on its surface arranged on a given grid pattern, at least one surface of said housing being of generally regular configuration, said one surface comprising a plurality of electrical conductive leads extending from said housing and being arrayed at selected locations corresponding to given intersections of orthogonally related grid lines for connection to said first electrical circuit, said one surface also comprising a plurality of housing supporting projections extending therefrom a distance less than said electrically conductive leads for raising said at least one surface above the surface of said conductors a sufficient amount to provide for further processing and use, means providing tactile and visual indicators for facilitating proper alignment of the housing with respect to the location of the conductors on the supporting member comprising said projections being arrayed at selected locations corresponding to given intersections of said grid lines, at least three of said projections being located such that the center of mass of the housing lies within the area defined by such projections, there being a different spatial array of projections on one side of the housing than on the other to provide non-symmetry in the array of projections for facilitating alignment of the housing during placement on the supporting member, and said housing supporting projections being cylindrically shaped insulating ceramic pegs secured to holes formed in said at least one surface of the housing by glass fusion.

3. A housing for first electrical circuit components adapted for mounting on a supporting member that supports electrical conductors on its surface arranged on a give grid pattern, at least one surface of said housing being of generally regular configuration, said one surface comprising a plurality of electrical conductive leads extending from said housing and being arrayed at selected locations corresponding to given intersections of orthogonally related grid lines for connection to said first electrical circuit, said one surface also comprising a plurality of housing supporting projections extending therefrom a distance less than said electrically conductive leads for raising said at least one surface above the surface of said conductors a sufficient amount to provide for further processing and use, means providing tactile and visual indicators for facilitating proper alignment of the housing with respect to the location of the conductors on the supporting member comprising said projections being arrayed at selected locations corresponding to given intersections of said grid lines, at least three of the projections being located such that the center of mass of the housing lies within the area defined by such three projections, there being a different spatial array of projections on one side of the housing than on another to provide the non-symmetry in the array of projections for facilitating alignment of the housing during placement on the supporting member, the housing supporting projections being integral embossments formed on said at least one surface of the housing, said at least one surface of the housing being formed from electrically conductive and ferromagnetic material and further including a sleeve of insulating material surrounding at least part of selected ones of the leads for supporting the housing on electrically conductive surfaces of the supporting member in a manner to raise the integrally embossed projections off of such conductive surface.

4. A housing for first electrical circuit components adapted for mounting on a supporting member that supports electrical conductors on its surface arranged on a given grid pattern, at least one surface of said housing being of generally regular configuration, said one surface comprising a plurality of electrical conductive leads extending from said housing and being arrayed at selected locations corresponding to given intersections of orthogonally related grid lines for connection to said first electrical circuit, said one surface also comprising a plurality of housing supporting projections extending therefrom a distance less than said electrically conductive leads for raising said at least one surface above the surface of said conductors a sufficient amount to provide for further processing and use, means providing tactile and visual indicators for facilitating proper alignment of the housing with respect to the location of the conductors on the supporting member comprising said projections being arrayed at selected locations corresponding to given intersections of said grid lines, at least three of the projections being located such that the center of mass of the housing lies within the area defined by such three projections, there being a different spatial array of projections on one side of the housing than on another to provide non-symmetry in the array of projections for facilitating alignment of the housing during placement on the supporting member, the sides of the housing being fabricated from electrically conductive material and further including grounding strips of conductive material attached to the sides of the housing and so positioned relative to the electrically conductive leads and projections as to fit into a logical extension of the equally spaced grid system, said housing being fabricated from electrically conductive ferromagnetic material and the projections being integral embossments formed on the said at least one surface of the housing, said housing supporting projections being cylindrically shaped insulating ceramic pegs secured to holes formed in the said at least one surface of the housing by glass fusion.

5. A housing according to claim 4 wherein the intersections of the equally spaced grid system are spaced apart a distance of some multiple of 0.150 inch.

6. A housing for first electrical circuit components adapted for mounting on a supporting member that supports electrical conductors on its surface arranged on a given grid pattern, at least one surface of said housing being of generally regular configuration, said one surface comprising a plurality of electrical conductive leads extending from said housing and being arrayed at selected locations corresponding to given intersections of orthogonally related grid lines for connection to said first electrical circuit, said one surface also comprising a plurality of housing supporting projections extending therefrom a distance less than said electrically conductive leads for raising said at least one surface above the surface of said conductors a sufficient amount to provide for further processing and use, means providing tactile and visual indicators for facilitating proper alignment of the housing with respect to the location of the conductors on the supporting member comprising said projections being arrayed at selected locations corresponding to given intersections of said grid lines, at least three of the projections being located such that the center of mass of the housing lies within the area defined by such three projections, there being a different spatial array of projections on one side of the housing than on another to provide non-symmetry in the array of projections for facilitating alignment of the housing during placement of the supporting member, said housing being fabricated from electrically conductive and ferromagnetic material and the projections being integral embossments formed on the said at least one surface of the housing, a sleeve of insulating material surrounding at least part of selected ones of the electrically conductive leads for supporting the housing on electrically conductive surfaces of the supporting member in a manner to raise the integrally embossed projections off of said conductive surface.

7. A housing according to claim 6 wherein the intersections of the equally spaced grid system are spaced apart a distance of some multiple of 0.150 inch.

8. A circuit arrangement comprising a printed circuit board, said board having printed wire electrical conductors arranged on a given grid pattern on at least one electrically insulating surface thereof, a housing in the form of a solid containing an enclosed electrical component, means for connecting said electrical component to desired points on at least some of said board conductors comprising a plurality of electrically conductive leads extending from at least one surface of said housing to contact respective board conductors and being arrayed in two groups at opposite ends of said surface with a space therebetween on said surface, said leads being arrayed at selected locations on said surface corresponding to given intersections of orthogonally related lines of said grid pattern and being symmetrically arrayed on said housing surface, means for spacing said one surface a given distance above said board surface, comprising projections extending from said housing surface in the space between said two groups of leads, means to provide tactile and visual indicators for facilitating proper alignment of the symmetrically arranged leads of said housing with respect to the conductors on said board comprising said projections being also arrayed at selected locations corresponding to given intersections of said grid lines but in a nonsymmetrical array with respect to the sides of the housing surface.

9. A circuit arrangement comprising a printed circuit board, said board having printed wire electrical conductors arranged on a given grid pattern on at least one electrically insulating surface thereof, a housing in the form of a rectangular solid containing an enclosed electrical component, means for connecting said electrical component surface, desired points on at least some of said board conductors comprising a plurality of electrically conductive leads extending from at least one surface of said housing to contact respective board conductors tactile being symmetrically arrayed in two symmetrical groups at opposite ends of said surface with a space therebetween on said surface, said leads being arrayed at selected locations on said surface corresponding to given intersections of orthogonally related lines of said grid pattern and being symmetrically arrayed on said housing surface, means for spacing said one surface a given distance above said board surface, comprising projections extending from said housing surface in the space between said two groups of leads, means to provide tactile and visual indicators for facilitating proper alignment of the symmetrically arranged leads of said housing with respect to the conductors on said board comprising said projections being also arrayed at selected locations corresponding to given intersections of said grid lines but in a nonsymmetrical array with respect to the sides of the housing surface.

* * * * *

UNITED STATES PATENT OFFICE
CERTIFICATE OF CORRECTION

Patent No. 3,621,112 Dated November 16, 1971

Inventor(s) Beryl C. Stickley; Edward G. Tutle

It is certified that error appears in the above-identified patent and that said Letters Patent are hereby corrected as shown below:

Column 3, line 53, cancel "shown in FIG. 5" and insert -- shown in FIG. 4 --

Column 7, line 12, cancel "glasS" and insert -- glass --

Column 7, line 36, cancel "and 12" and insert -- and 13 --

Column 8, line 39, cancel "which within" and insert -- which are within --

Column 11, line 9, cancel "component surface, desired points" and insert -- component to desired points --

Signed and sealed this 23rd day of January 1973.

(SEAL)
Attest:

EDWARD M.FLETCHER,JR.
Attesting Officer

ROBERT GOTTSCHALK
Commissioner of Patents